United States Patent [19]

Reichel

[11] Patent Number: 5,097,235
[45] Date of Patent: Mar. 17, 1992

[54] HIGH-PASS FILTER CIRCUIT

[75] Inventor: Thomas Reichel, Baldham, Fed. Rep. of Germany

[73] Assignee: Rohde & Schwarz GmbH & Co. KG, Fed. Rep. of Germany

[21] Appl. No.: 635,979

[22] Filed: Dec. 31, 1990

[30] Foreign Application Priority Data

Jan. 4, 1990 [DE] Fed. Rep. of Germany ....... 4000131

[51] Int. Cl.$^5$ .............................................. H03H 7/00
[52] U.S. Cl. .................................... 333/167; 333/173; 333/166
[58] Field of Search ............... 333/167, 173, 174, 185, 333/166; 328/167; 307/520

[56] References Cited

U.S. PATENT DOCUMENTS 4,893,035  1/1990  Reynolds et al. .................... 328/167

OTHER PUBLICATIONS

Schultz, W., "Messen und Prüffen mit Rechtecksignalen", Philips Technische Bibliothek, 1966, pp. 51-52.

Primary Examiner—Eugene R. LaRoche
Assistant Examiner—Ali Neyzari
Attorney, Agent, or Firm—Hill, Van Santen, Steadman & Simpson

[57] ABSTRACT

In a high-pass filter circuit comprising a high-pass filter having a transfer function in accordance with the following equation:

$$F_H(p) = \frac{p^N + a_{N-1}p^{N-1} + a_{N-2}p^{N-2} + \ldots + a_1p}{p^N + b_{N-1}p^{N-1} + b_{N-2}p^{N-2} + \ldots + b_1p + b_0}$$

$$b_0 \neq 0$$

a compensation network is connected in series with said high-pass filter, said network comprising a summing circuit, a continuous line and a low-pass filter connected in parallel therewith, said low-pass filter having a transfer function in accordance with the following equation $$F_T(p) = \frac{d_{K-1}p^{K-1} + \ldots + d_1p + d_0}{p^K + c_{K-1}p^{K-1} + \ldots + c_1p + c_0} \quad (K \geq 1)$$

and the filter coefficient $d_{K-1}$ of the low-pass filter being chosen to be equal to the difference of the filter coefficients $b_{n-1} - a_{n-1}$ of said high-pass filter.

9 Claims, 10 Drawing Sheets

| HIGH-PASS CIRCUIT | $F_H$ | $F_T = F_K - 1$ | NORMALIZED COMPLEX FREQUENCY |
|---|---|---|---|
| A | $\dfrac{P}{P+1}$ | $\dfrac{1}{P+1/2}$ | |
| B | $\dfrac{P}{P+1}$ | $\dfrac{1}{P+1} \cdot \left(1 + \dfrac{1}{P+4}\right)$ | |
| C | $\dfrac{P}{P-P_{..0}}$ | $\dfrac{-P_{..0}(P-P_{01})}{(P-P_{..1})(P-P^*_{..1})}$ | $P_{..0} = -1{,}4623$<br>$P_{..1} = -1{,}1580 + J1{,}1048$<br>$P_{..1}^* = -1{,}1580 - J1{,}1048$<br>$P_{01} = -2{,}3160$ |

$$P = \frac{p}{2\pi f_g} = J\frac{f}{f_g}$$

FIG. 2

HIGH-PASS FILTER CIRCUIT

BACKGROUND OF THE INVENTION

1. Field of the Invention

The invention is directed to a high-pass filter circuit.

High-pass filters of the type used, for instance, for separating the d.c. voltage component of a.c. voltages, exhibit the property that, although the spectrum of an a.c. voltage which includes exclusively components above the limit frequency is not changed by the high-pass filter, the time characteristic of the non-sinusoidal voltages is considerably corrupted because high-pass filters have a frequency-dependent envelope delay, whereby discrete spectral components of the a.c. voltage are delayed differently. This effect is disturbing wherever the waveform or parameters identifying the same, such as the peak value of an a.c. voltage must be analyzed or measured.

2. Description of the Prior Art

It has been known for the solution of this problem to select a limit frequency which is as low as possible so as to provide a large frequency spacing relative to the spectrum of the a.c. voltage (Schultz, W., Messen und Prüfen mit Rechtecksignalen, Eindhoven 1966, NV Philips Gloeilampenfabriken). But very often this feature cannot be realized.

If, for instance, the enlargement of the peak value of a symmetrical square-wave a.c. voltage were to remain limited to 2% by the high-pass filter, the 3 db limit frequency should be 0.013 times that of the lowest occurring frequency. Of course, such an extremely low limit frequency would mean a correspondingly longer transient time of the high-pass filter. In the case of a voltmeter with a lower measuring limit of 10 Hz this would mean that 8.5 s would be required for a decrease down to 0.1% of a d.c. voltage transient.

SUMMARY OF THE INVENTION

It is therefore the object of the invention to provide a high-pass filter circuit which, irrespective of a high limit frequency and a correspondingly fast transient response exhibits negligibly slight delay distortions in the pass band.

Based on a high-pass filter circuit as specified in the foregoing, the above-specified object is achieved by the provision of a high-pass filter circuit which comprises a high-pass filter having a transfer function in accordance with the equation $$F_H(p) = \frac{p^N + a_{N-1}p^{N-1} + a_{N-2}p^{N-2} + \ldots + a_1 p}{p^N + b_{N-1}p^{N-1} + b_{N-2}p^{N-2} + \ldots + b_1 p + b_0}$$

$$b_0 \neq 0$$

connected to in series with the compensation network which includes a summing circuit, a continuous line connected between the high-pass filter and the summing circuit, and a low pass filter connected in parallel with the continuous line connection to the summing circuit and having a transfer function in accordance with the equation $$F_T(p) = \frac{d_{K-1}p^{K-1} + \ldots + d_1 p + d_0}{p^K + c_{K-1}p^{K-1} + \ldots + c_1 p + c_0} \quad (K \geq 1)$$

wherein the filter coefficient $d_{k-1}$ of the low-pass filter is selected to be equal to the difference of the filter coefficients $b_{N-1} - a_{N-1}$ of the high-pass filter.

According to a particular feature of the invention, the high-pass filter circuit is particularly characterized in that all of the zeros of the transfer function of the high-pass filter are zeros.

According to another feature of the invention, the high-pass filter circuit is particularly characterized in that all of the poles of the transfer function of the high-pass filter are real poles.

According to another feature of the invention, the high-pass filter circuit is particularly characterized in that the high-pass filter is of the first order and has a normalized transfer function of $(P/P+1)$.

According to another feature of the invention, the high-pass filter circuit is particularly characterized in that the low-pass filter of the compensation network has only real poles.

According to another feature of the invention, the high-pass filter circuit is particularly characterized in that the low-pass filter of the compensation network is of the first order and has a normalized transfer function of $(1/(P+\frac{1}{2}))$.

According to another feature of the invention, the high-pass filter circuit is particularly characterized in that the low-pass filter of the compensation network is one of the second order and has a normalized transfer function of $$(1/(P+1)) \cdot (1 + (1/(P+4))).$$

According to another feature of the invention, the high-pass filter circuit is particularly characterized in that the compensation network comprises cascade-connected first-order low-pass filters.

According to another feature of the invention, the high-pass filter circuit is particularly characterized in that an additional high-pass filter is connected in series to the input of the low-pass filter of the compensation network.

Advantageous further developments will be apparent from the subclaims.

The compensation network according to the present invention makes it possible that the envelope delay of the entire high-pass filter circuit within the pass band above the limit frequency is nearly constant. A high-pass filter circuit according to the invention can be designed very easily in accordance with known dimensioning rules.

The mode of operation of the compensation network according to the present invention can be explained by the fact that with a low-pass filter an approximately inverse square-wave transfer characteristic is achieved as compared with the high-pass filter and that thereby the square-wave transfer response of the uncompensated high-pass filter, which is essentially due to the phase non-linearity, can be compensated.

BRIEF DESCRIPTION OF THE DRAWINGS

Other objects, features and advantages of the invention, its organization, construction and operation will be best understood from the following detailed description taken in conjunction with the accompanying drawings, in which

FIG. 2 is a table illustrating three examples of possible compensation networks;

DESCRIPTION OF THE PREFERRED EMBODIMENTS

Figure 1:
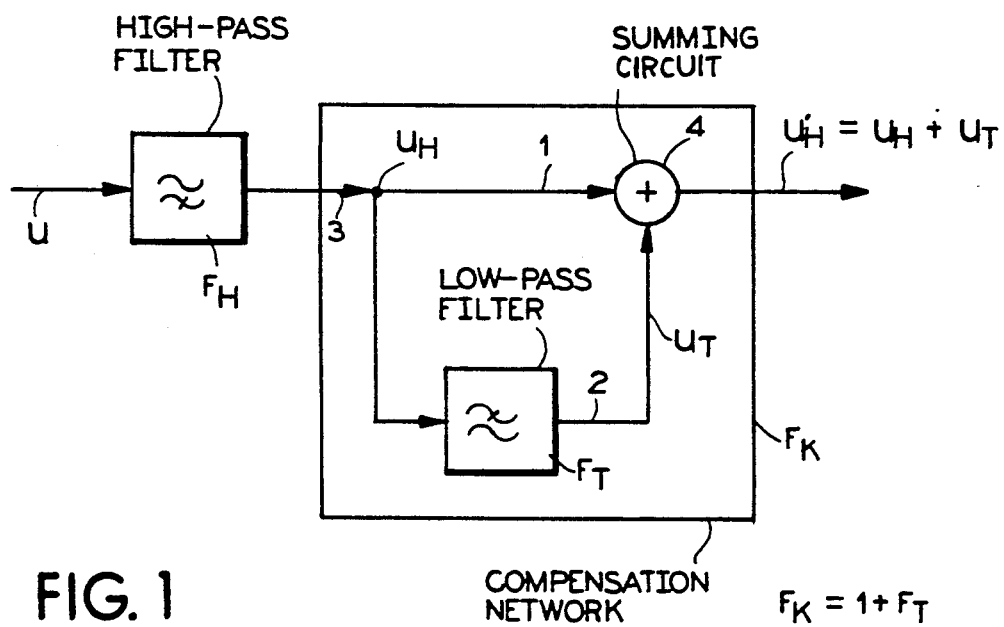
FIG. 1 is the schematic diagram of a first embodiment of the high-pass filter circuit according to the invention.

FIG. 1 is a schematic diagram showing a high-pass filter circuit according to the invention and comprising a high-pass filter $F_H$ the output voltage of which is applied to a compensation network $F_K$. Said compensation network includes two branch circuits 1 and 2 which are connected in parallel and which branch in parallel from the input and are recombined in a summing circuit 4. The branch circuit 1 is a continuous line without any delay while a low-pass filter $F_T$ is disposed in the branch circuit 2. The transfer function of the high-pass filter $F_H$ may be expressed in known manner—provided it comprises discrete linear components (without any lines)—as the quotient of two polynomials in p:

$$F_H(p) = \frac{p^N + a_{N-1}p^{N-1} + a_{N-2}p^{N-2} + \ldots + a_1 p}{p^N + b_{N-1}p^{N-1} + b_{N-2}p^{N-2} + \ldots + b_1 p + b_0}, b_0 \neq 0 \quad (1)$$

wherein p is a complex frequency, N is a high-pass filter order, and a and b are each filter coefficients.

The transfer function of the low-pass filter $F_T$ can be expressed similarly in the following way:

$$F_T(p) = \frac{d_{K-1}p^{K-1} + \ldots + d_1 p + d_0}{p^K + c_{K-1}p^{K-1} + \ldots + c_1 p + c_0} (K \geq 1) \quad (2)$$

wherein again p is a complex frequency, K is the low-pass filter order and d and c again each are filter coefficients.

According to the invention the transfer function $F_T(p)$ of the low-pass filter should be selected such that $$d_{K-1} = b_{N-1} - a_{N-1} \quad (3)$$

Provided this relationship between the filter coefficients $a_{N-1}$ and $b_{N-1}$ of equation (1) and the filter coefficient $d_{K-1}$ of equation (2) is satisfied, the high-pass filter circuit of FIG. 1 has a linear phase response in the pass band, which means that the high-pass filter $F_H$ is phase-compensated. The remaining dimensioning of the filter coefficients is substantially governed by the desired characteristic of the frequency response. In particular, the slope steepness of the cutoff slope is determined only by the high-pass circuit $F_H$ whereas the compensation network merely affects the amplitude and phase frequency characteristic in the transition band. It is for this reason that the desired slope steepness is correspondingly selected when the high-pass filter $F_H$ is designed and will then also determine the slope steepness of the entire circuit.

The conversion of a given rational transfer function for instance in accordance with equation (1) or (2) to an electric circuit is known and is extensively described for instance in:

R.P. Sallen and E.L. Key: A practical method of designing RC active filters, IRE Transactions on Circuit Theory, CT-2, 1955, pp. 74 et seq.

N. Balabanian and B. Patel: Active realization of complex zeros, IEEE Transactions on Circuit Theory, CT-10, 1963, pp. 299 et seq.

L. Weinberg: Network Analysis and Synthesis, New York (McGraw-Hill), 1962.

N. Balabanian: Network Synthesis, Englewood Cliffs, N.J. (Prentice-Hall), 1961.

Hence, if the transfer function of a high-pass filter or a low-pass filter is known, an electrical circuit can be derived therefrom in a simple way and in accordance with known rules.

Of course, other circuits may be derived in the same way from the transfer function of the compensated high-pass filter, which function can readily be calculated from the design of a circuit arrangement according to the invention.

The advantage of the solution provided by the present invention resides in the easy way of technical realization and the favourable high-frequency properties:

Assuming that the summation is performed by an amplifier which is provided in any case, it is substantially only the low-pass filter that has to be added.

As the limit frequency of the low-pass filter $F_T$ is similar to that of the high-pass filter $F_H$, only relatively low frequencies must be processed in the low-pass branch circuit 2, which results in a simple realization.

As the high-frequency signal components are transmitted only via the direct branch circuit 1, the high-frequency properties will remain almost unchanged in relation to a non-compensated high-pass filter in case the summing junction 4 need not be provided separately (see above).

Since the circuit according to the invention comprises a conventional high-pass filter $F_H$, the same can be implemented—for instance in an a.c. voltage-coupled measuring instrument—as usual as an RC element, and can be disposed immediately following the input pole so as to perform the d.c. voltage separation without said d.c. voltage being applied to any further circuit elements.

The most frequently used high-pass filters such as used especially for d.c. voltage separation are first-order high-pass filters (N=1 in equation (1)). The table of FIG. 2 illustrates three examples for the compensation of a first-order high-pass filter $F_H$ by three different compensation networks $F_T$. In these examples the complex frequency is normalized to $2\pi$ fg (normalized frequency variable P); $f_g$ is the 3 db limit frequency of the high-pass filter $F_H$ for the high-pass filter circuits A and B. The three compensation networks are designed such that the absolute value of the transfer function of the overall high-pass filter circuit for $f \geq 5f_g$ will not deviate from the value 1 by more than that of the high-pass filter $F_H$ in the circuits A and B.

The high-pass filter circuit A of FIG. 2 is equipped with a first-order compensation network $F_T$, whereas the circuit B is equipped with a second-order compensation network and the circuit C is equipped with a second-order compensation network but with conjugate complex poles, and the high-pass filter $F_H$ is respectively a first-order high-pass filter.

Figure 3:
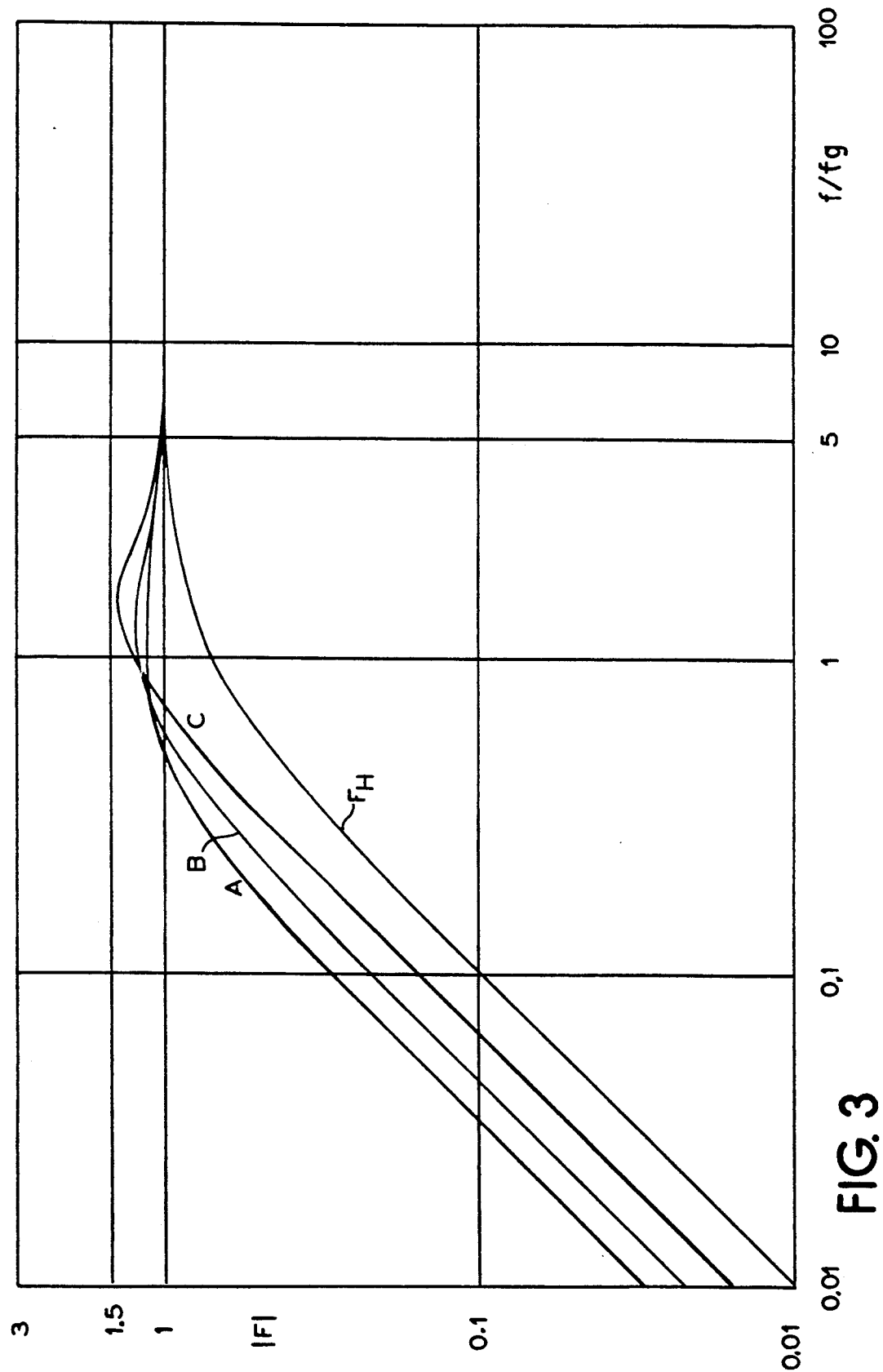
FIG. 3 is a graphic illustration showing the corresponding amplitude frequency characteristic.
Figure 4:
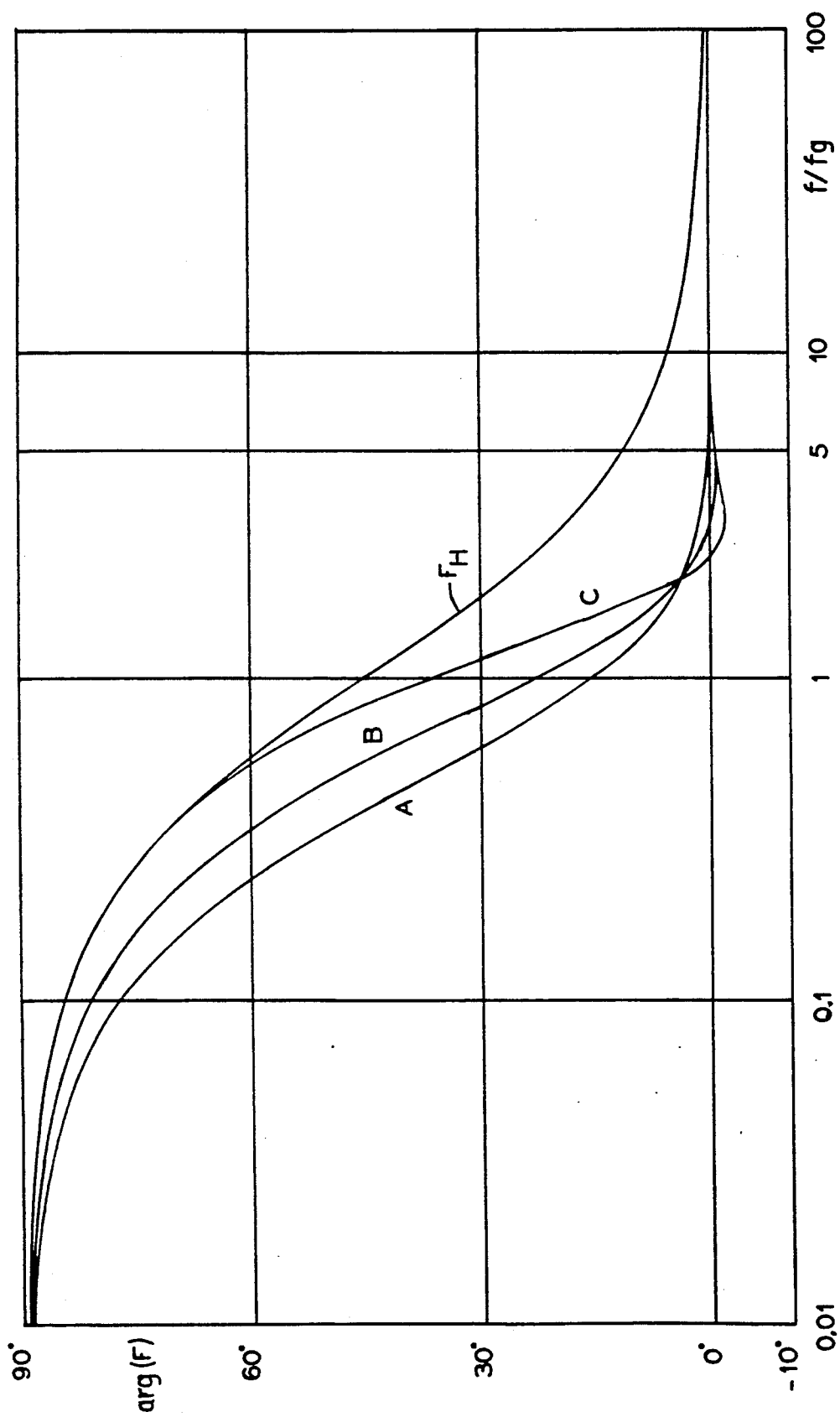
FIG. 4 is a graphic illustration which shows the phase frequency characteristic.
Figure 5:
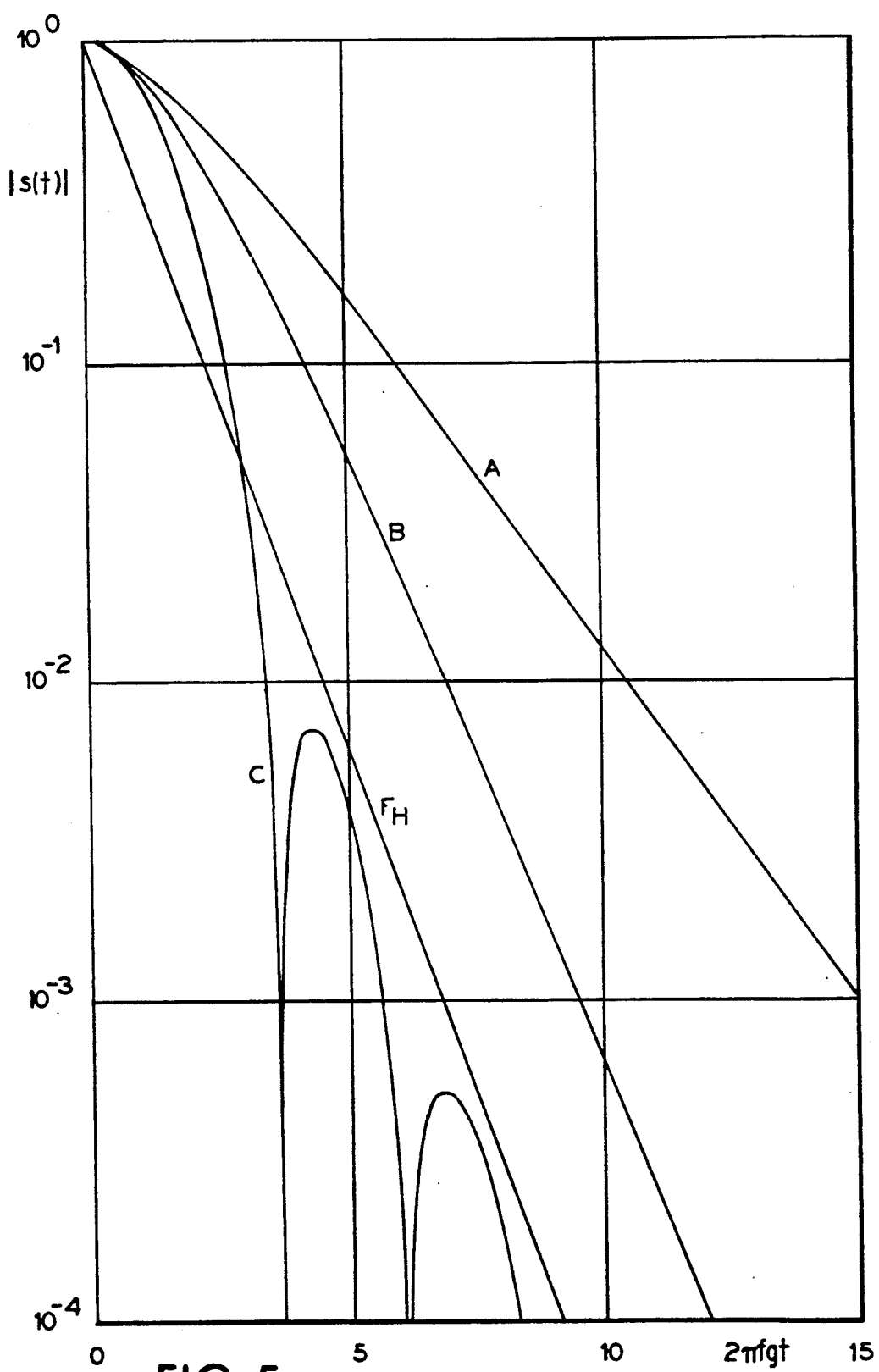
FIG. 5 is a graphic illustration which shows the step-function response.
Figure 6:
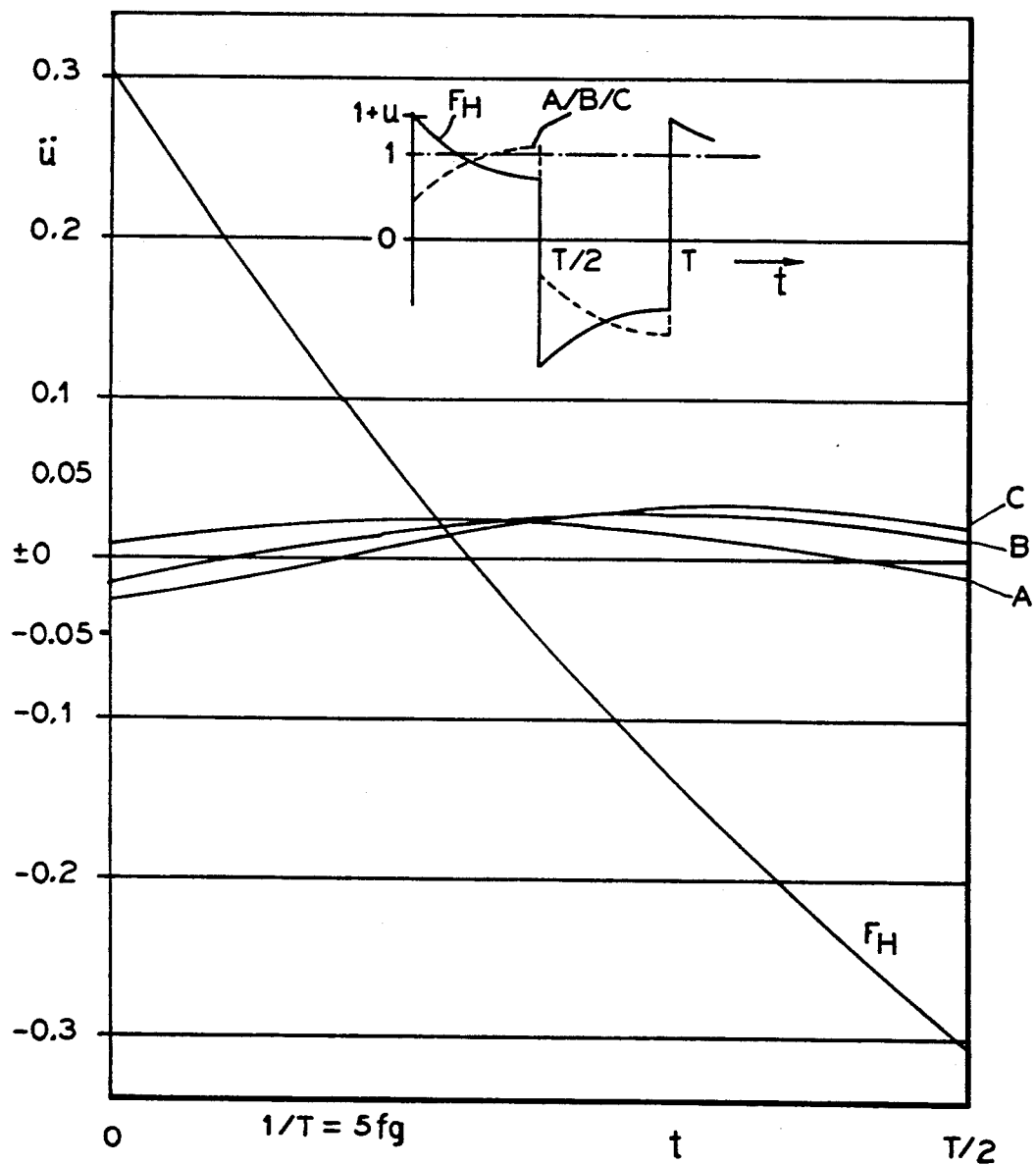
FIGS. 6 and 7 are graphic illustrations respectively showing the square-wave transfer characteristic of the high-pass filter circuits of FIG. 2.
Figure 7:
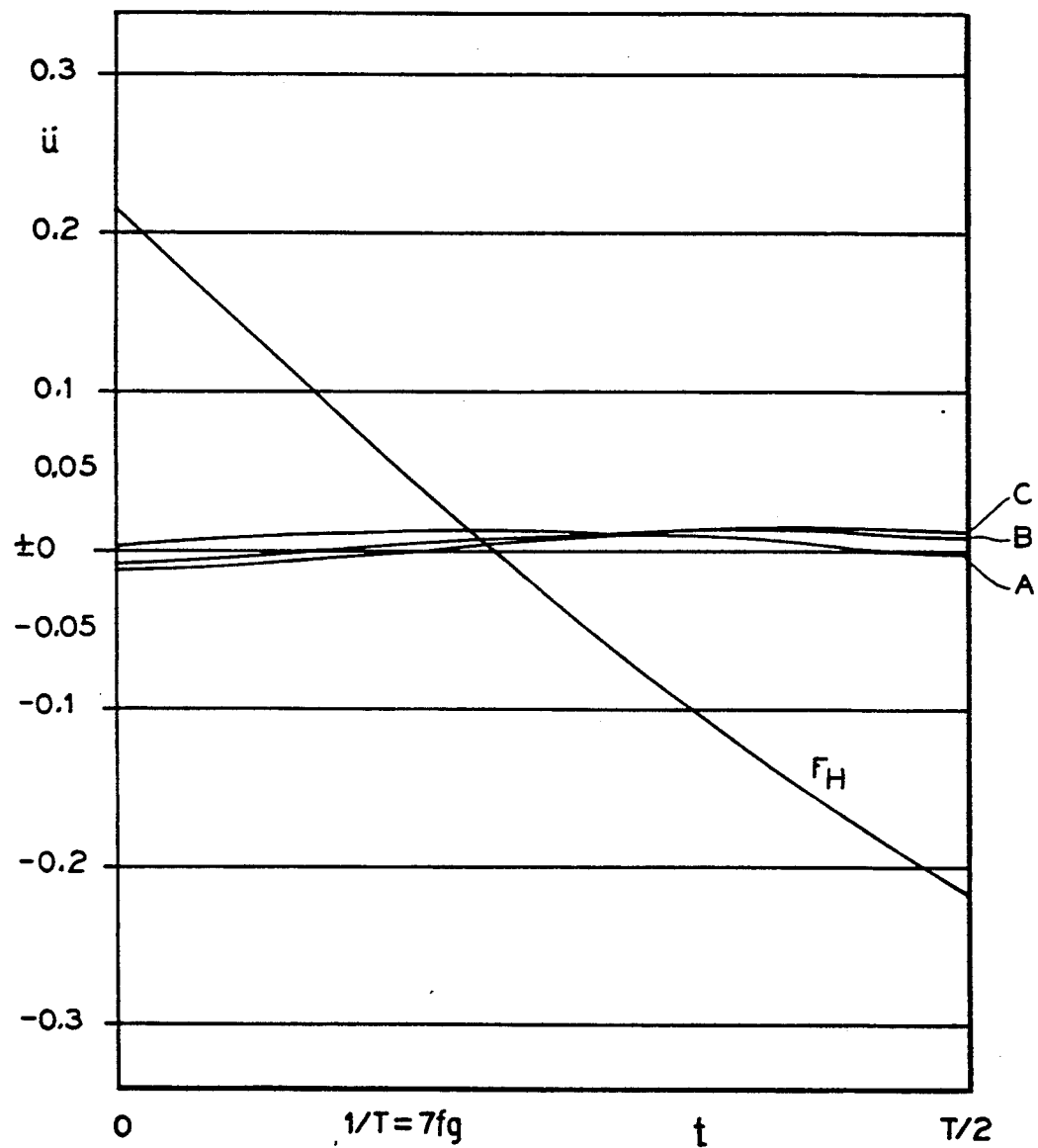

FIG. 3 shows the corresponding amplitude frequency response, FIG. 4 shows the phase frequency response, FIG. 5 shows the step-function response, and FIGS. 6 and 7 show the square-wave transfer characteristic of the high-pass filter circuits A, B and C and of the high-pass filter $F_H$ for the circuits A and B.

In circuit A the one degree of freedom of the compensation network which remains after the linear-phase status has been fixed has been utilized so that the amount of the transfer function in the entire frequency range deviates from the desired value 1 by no more than that of the high-pass filter $F_H$. The amplitude frequency response of FIG. 3 shows only a slight peaking of 14% at the lower end of the pass band. In the stop band, the amplitude frequency response is shifted relative to the high-pass $F_H$ by the factor 3 towards lower frequencies. The square-wave transfer characteristic of FIGS. 6 and 7 is very good due to the linear-phase state in the pass band, and the slight peaking of about 2.5% at $5f_g$ is due almost exclusively to the boosting of the amplitude frequency response by 2%. The transient recovery time in respect of a square-wave step—with a residual error of 0.01...0,1%—will take about twice as long as with the non-compensated high-pass $F_H$, but this is faster by a factor of 8 in relation to a non-compensated high-pass with a reduced limit frequency and a peak value error of 2% for symmetrical square-wave voltages.

The filter circuit B employs a compensation network of the second order with real poles. The transient condition in respect of a square-wave step, which is extended by only about 30% relative to the high-pass $F_H$, is obtained at the cost of a greater peaking of the amplitude frequency response at the lower end of the pass band (23%) and of increased design effort. In the stop band, the amplitude frequency response is shifted by a factor of 2.25 relative to the high-pass $F_H$ towards lower frequencies, and in the pass band the deviation from the desired value 1 is proportional $f^{-4}$ similar to a second-order Butterworth high-pass filter. The square-wave transfer characteristic is not quite as good as with the circuit A.

In the filter circuit C a first-order high-pass is again employed, although with a 3 db limit frequency of 1.46 $f_g$, and the compensation network is again a second-order one, however with conjugate complex poles as specified in FIG. 2. The very fast transient response is obtained at the cost of an even more pronounced peaking in the pass band (39%). In excess of $5 f_g$ the circuit C operates like the circuit B while the amplitude frequency response of the cutoff slope is approximately between that of the non-compensated high-pass filter $F_H$ and that of the circuit B. Due to the negative phase in the pass band, the square-wave transfer characteristic is even poorer than with the circuit B.

Of course, in the same way it is possible to phase-compensate higher-order high-pass filters by corresponding compensation networks. Basically, all commonly known high-pass filters are suited for the measure in accordance with the present invention, and especially suited high-pass filters are those with real poles the number of which is governed by the desired steepness of the cutoff slope or is otherwise predetermined. When there are no special requirements as to the mutual positions of the poles, they are preferably all of them chosen to be of equal size and are dimensioned such that the high-pass filter $F_H$ approximately satisfies the demands on the amplitude frequency response in the pass band.

There are then several possibilities for the design of the associated compensation network $F_T$.

A first possibility is to phase-compensate every pole point of the high-pass filter by a compensation network A, B or C according to FIG. 2. The deviations of the amplitude frequency response from the nominal value 1 approximately correspond to those of the non-compensated high-pass in the pass band. This can be achieved with little effort at calculation, because the compensation networks according to FIG. 2 are known and need only be denormalized. In order to keep the circuit complexity and the peaking in the pass band within limits, a compensation network according to column A of FIG. 2 is preferred.

The compensation with a first-order compensation network (K=1) is another possibility. One proceeds from a coefficient $c_o$ of the magnitude of the absolute value of the poles of the high-pass to be compensated, and the filter coefficient $d_o$ is then calculated in accordance with equation (3). Thereby the compensation network is determined. Then, the amplitude frequency response of the overall circuit is calculated, and the overall circuit is frequency-shifted so that the requirements to the amplitude frequency response are satisfied. The peaking in the pass band can be influenced by $c_o$. The smaller $c_o$ is chosen, the less peaking will occur.

A third possibility is the design of a higher-order compensation network with the help of a computer. This offers the advantage that the uncompensated high-pass filter need not be frequency-shifted in order to satisfy the requirements as to the amplitude frequency response. As compared to the first possibility, this third possibility generally results in a simpler compensation network, especially when the low-pass filter is configured from cascaded first-order low-pass filters. In this case equation (2) may be given an equivalent form from which the block diagram is directly apparent:

$$F_T(p) = \quad (4)$$

$$\frac{v_1}{1 - \frac{p}{p_1}} \cdot \left(1 + \frac{v_2}{1 - \frac{p}{p_2}} \cdot \left(1 + \ldots \cdot \left(1 + \frac{v_K}{1 - \frac{p}{p_K}}\right)\right)\right)$$

$p_1 \ldots p_K$ are the poles and $v_1 \ldots v_K$ are the d.c. current gains of the first-order low-pass filters. The phase-linearity condition is satisfied solely by the first low-pass filter as follows:

$$p_1 \cdot v_1 = a_{N-1} - b_{N-1}. \quad (5)$$

The design of the network is effected as follows:

Starting out from a pole point $p_1$ of the order of magnitude of the poles of the high-pass filter to be compensated, $v_1$ is determined in accordance with equation (5). Then, $p_2$ and $v_2$ of the second low-pass are varied such that amplitude and phase frequency response of the compensated high-pass filter reach an optimum, while the low-pass filters with higher indices are still ineffective ($v_3 = v_4 = \ldots = v_k = 0$). Then, the third low-pass filter is connected, and $p_3$ and $v_3$ are optimized etc. The influence of the low-pass filters decreases with increasing index. The optimizing operation may possibly have to be repeated with a different initial value for $p_1$.

Figure 8:
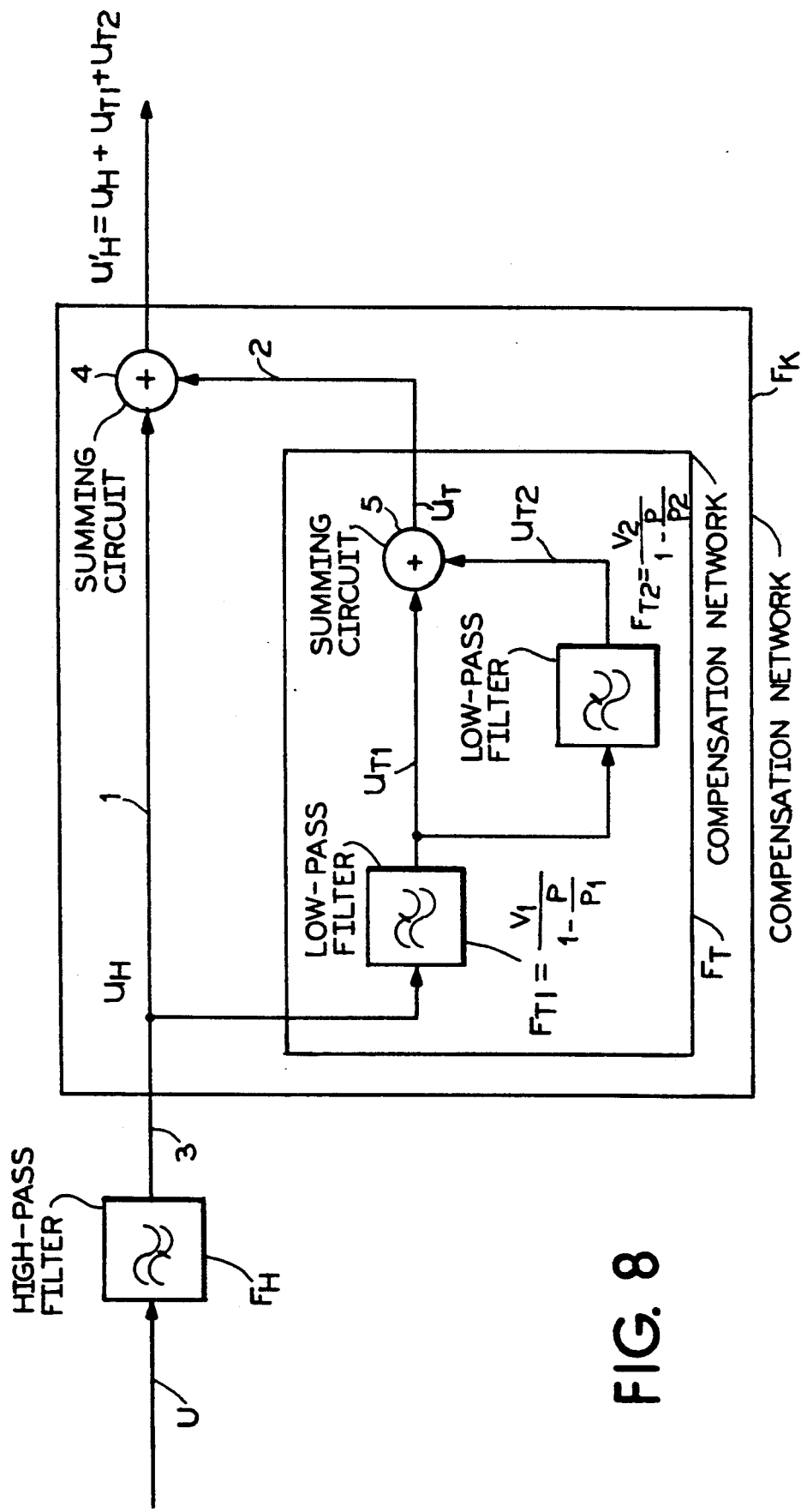
FIGS. 8, 9 and 10 are schematic representation of further embodiments of a high-pass filter circuit according to the present invention.

FIG. 8 is the block diagram corresponding to equation (4) for K=2.

The compensation network substantially consists of K, which in the example comprises two first-order low-pass filters $F_{T1}$ and $F_{T2}$ the output signals of which are added to the high-pass filtered signal in the summing circuit 4 to correct said signal. For practical use, the summing circuit 5 is combined with the summing circuit 4.

Figure 9:
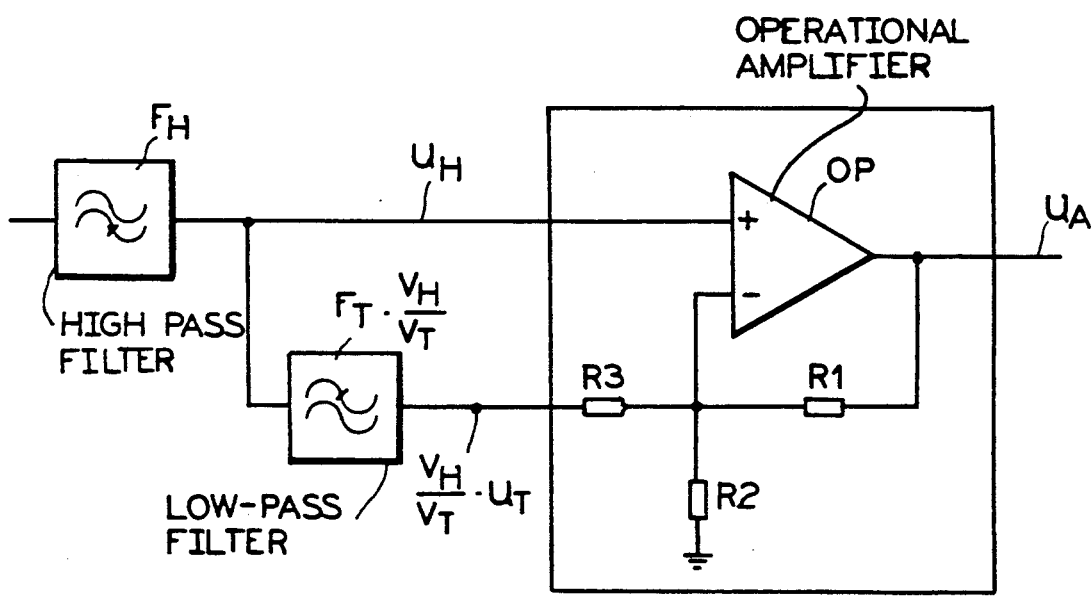

With a corresponding band width of the transfer path, the summing circuit 4 of the compensation network must be designed in accordance with aspects of high-frequency technique. When the signal path includes an amplifier anyhow, the same may simultaneously be used as summing circuit, so that the compensation network will be connected to the input of the amplifier and summing is taken over by said amplifier. FIG. 9 shows a possible circuit with an operational amplifier OP connected as a non-inverting amplifier, to which the output signal of the low-pass filter $F_T$ is supplied via a resistor R3. The different amplification of the summing circuit for the signals $U_H$ and $U_T$—($V_H$ or $V_T$ respectively)—is suitably effected by corresponding matching of the d.c. current amplification of the output of the filter $F_T$.

Figure 10:
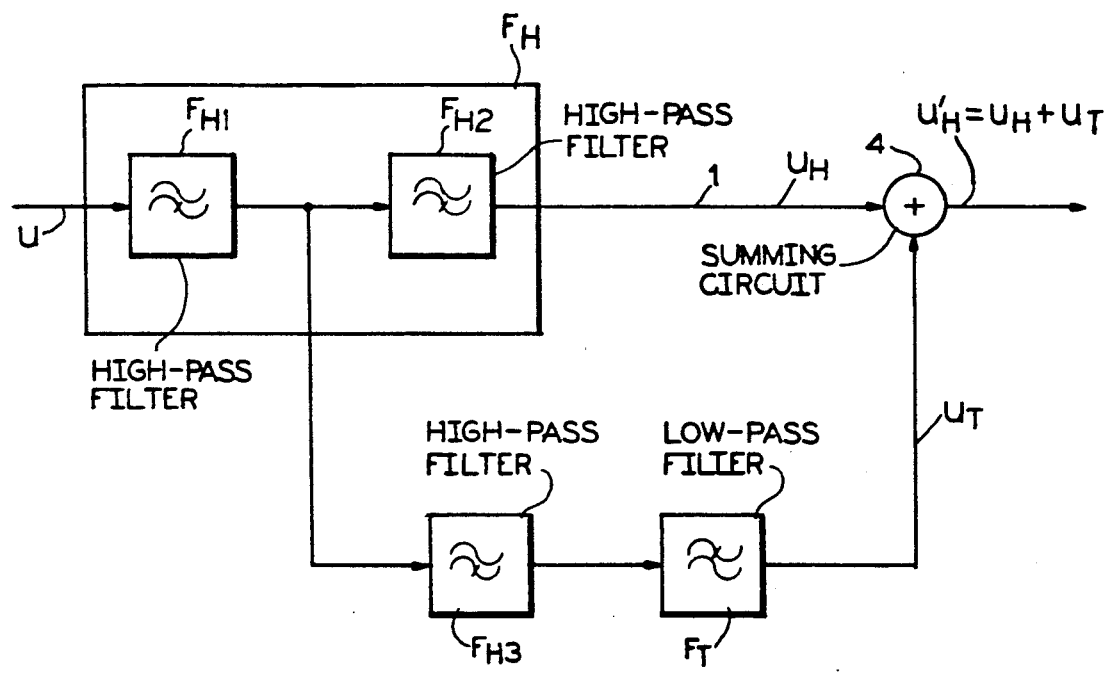

FIG. 10 shows a modified embodiment of the basic circuit of FIG. 1, in which the input signal for the low-pass filter $F_T$ of the compensation network is not directly supplied from the non-compensated high-pass filter $F_H$ but is supplied indirectly via an additional high-pass filter $F_{H3}$. This additional high-pass filter is advantageous in spite of the additional effort and/or expense if, for example, the input bias current of the summing circuit produces a large offset voltage in the signal branch which appears, with an amplification by the factor $F_T(0)$, also at the other input of the summing circuit and is added thereto. When said high-pass filter $F_{H3}$ is provided, such a positive feedback effect is eliminated. The transfer function of this additional high-pass filter $F_{H3}$ equals the transfer function of the uncompensated high-pass filter $F_{H1}$ in branch 1 behind the input-side branching point, i.e. for a non-compensated first-order high-pass filter $F_H$ one also selects the first-order high-pass filter $F_{H3}$. For a non-compensated second-order or higher-order high-pass filter $F_H$ the additional high-pass filter $F_{H3}$ of a correspondingly higher order would have to be selected, but the design effort may be reduced in that case by dividing the multi-pole high-pass filter $F_H$ into two series-connected high-pass filters $F_{H1}$ and $F_{H2}$ and supplying the additional high-pass filter $F_{H3}$ through the junction of these two high-pass filters $F_{H1}$ and $F_{H2}$ as illustrated in FIG. 10. In this case it will only be necessary again to select the high-pass filters $F_{H2}$ and $F_{H3}$ effective after the branching point so as to have the same transfer function and to provide to this end, for example, first-order high-pass filters again. In this connection it is also possible to replace in branch 2 portions of the low-pass filter $F_T$ by portions of the high-pass filter $F_{H3}$, and it is only essential that the filter characteristic predetermined by the high-pass filter $F_{H3}$ and the low-pass filter $F_T$ connected in series therewith is maintained.

Although I have described my invention by reference to particular illustrative embodiments thereof, many changes and modifications of the invention may become apparent to those skilled in the art without departing from the spirit and scope thereof. I therefore intend to include within the patent warranted hereon all such changes and modifications as may reasonably and properly be included within the scope of my contribution to the art.

I claim:

1. A high-pass filter circuit comprising:
a high-pass filter having a transfer function in accordance with the equation $$F_H(p) = \frac{p^N + a_{N-1}p^{N-1} + a_{N-2}p^{N-2} + \ldots + a_1p}{p^N + b_{N-1}p^{N-1} + b_{N-2}p^{N-2} + \ldots + b_1p + b_0}$$

$$b_0 \neq 0;$$

a compensation network connected in series with said high-pass filter and comprising a summing circuit including a first input, a second input and an output constituting an output for said high-pass filter circuit, a continuous line connected between said high-pass filter and said first input of said summing circuit, and a low-pass filter connected in parallel with said continuous line between said high-pass filter and said second input of said summing circuit, said low-pass filter having a transfer function in accordance with the equation $$F_T(p) = \frac{d_{K-1}p^{K-1} + \ldots + d_1p + d_0}{p^K + c_{K-1}p^{K-1} + \ldots + c_1p + c_0} \quad (K \geq 1);$$

wherein
the filter coefficient $d_{K-1}$ of said low-pass filter is selected to be equal to the difference of the filter coefficients $b_{N-1} - a_{N-1}$ of said high-pass filter.

2. The high-pass filter circuit of claim 1, wherein:
all of the zeros of the transfer function of said high-pass filter are zero.

3. The high-pass filter circuit of claim 2, wherein:
all of the poles of the transfer function of said high-pass filter are real poles.

4. The high-pass filter circuit of claim 3, wherein:
said high-pass filter is a first-order high-pass filter and has a normalized transfer function of $(P/(P+1))$.

5. The high-pass filter circuit of claim 1, wherein:
said low-pass filter of said compensation network has only real poles.

6. The high-pass filter circuit of claim 4, wherein:
said low-pass filter of said compensation network is a first-order low-pass filter and has a normalized transfer function of $1/(P+1)$.

7. The high-pass filter circuit of claim 4, wherein:
said low-pass filter of said compensation network is a second-order low-pass filter and has a normalized transfer function of $(1/(P+1)) \cdot (1+(1/(P+4)))$.

8. The high-pass filter circuit of claim 7, wherein:
said compensation network comprises cascade-connected first-order low-pass filters.

9. The high-pass filter circuit of claim 1, and further comprising:
an additional high-pass filter connected in series to said input of said low-pass filter of said compensation network.

* * * * *